United States Patent [19]

Miller

[11] Patent Number: 5,038,117
[45] Date of Patent: Aug. 6, 1991

[54] MULTIPLE-MODULATOR FRACTIONAL-N DIVIDER

[75] Inventor: Brian M. Miller, Liberty Lake, Wash.

[73] Assignee: Hewlett-Packard Company, Palo Alto, Calif.

[21] Appl. No.: 579,469

[22] Filed: Sep. 7, 1990

Related U.S. Application Data

[63] Continuation of Ser. No. 469,656, Jan. 23, 1990, abandoned.

[51] Int. Cl.⁵ .......................................... H03L 7/183
[52] U.S. Cl. ..................................... 331/16; 331/1 A; 455/260
[58] Field of Search ...................... 331/1 A, 16, 18, 25; 375/120; 455/260

[56] References Cited

U.S. PATENT DOCUMENTS

| | | | |
|---|---|---|---|
| 3,928,813 | 12/1975 | Kingsford-Smith | 331/1 A |
| 4,204,174 | 5/1980 | King | 331/10 |
| 4,609,881 | 9/1986 | Wells | 331/1 A |
| 4,694,475 | 9/1987 | Mehrgardt | 377/48 |
| 4,758,802 | 7/1988 | Jackson | 331/10 |
| 4,800,342 | 1/1989 | Jackson | 331/10 |
| 4,816,774 | 3/1989 | Martin | 331/1 A |
| 4,918,403 | 4/1990 | Martin | 331/1 A |

FOREIGN PATENT DOCUMENTS 340870 5/1989 European Pat. Off. .
353399 5/1989 European Pat. Off. .

*Primary Examiner*—David Mis

[57] ABSTRACT

A fractional-N type frequency synthesizer includes a frequency divider having a selectable integer divide number which is periodically temporarily altered to provide an average rational divide number for the frequency divider. A number of modulator circuits coupled in cascade fashion provide a zero sum modulation signal which varies the value of the frequency divider divisor value such that the net change in divisor value due to the modulation signal is zero thereby reducing phase noise resulting from the temporary altering of the integer divisor value close to the frequency synthesizer carrier frequency.

10 Claims, 8 Drawing Sheets

$\mathcal{L}(f)$ [dBc/Hz] vs f[Hz]

MULTIPLE-MODULATOR FRACTIONAL-N DIVIDER

This application is a continuation of application Ser. No. 07/469,656, filed Jan. 23, 1990, now abandoned.

BACKGROUND OF THE INVENTION

The present invention relates generally to signal synthesizers and more particularly to frequency synthesizers utilizing fractional-N techniques to provide an output frequency which is related to a reference frequency by a rational divisor N.F where N is an integer portion and F is a fractional portion of the divisor.

A frequency synthesizer is a device which generates an output signal having a frequency which is an exact multiple of a reference frequency, the accuracy of the output signal frequency typically determined by the accuracy and stability of the referenced frequency source. Frequency synthesizers utilizing a phase lock loop (PLL) to provide an output signal having a selectable, precise and stable frequency are well known in the art. Typically a PLL includes a tunable oscillator such as a voltage controlled oscillator (VCO), the output of which is locked to a known reference signal by means of a phase comparator. The phase comparator generates an output voltage or current that is proportional to the phase difference between the known reference signal by means of a phase comparator. The phase comparator generates an output voltage or current that is proportional to the phase difference between the known reference signal and the VCO output signal. The output of the phase comparator is coupled back to the input of the VCO to tune and lock the VCO to a desired frequency. This forces the VCO output to have the same frequency as the reference signal. To provide a frequency synthesizer having a variable output frequency, a divisor circuit is interposed between the output of the VCO and the phase comparator, wherein the VCO output frequency is divided by a selectable divisor before it is compared with the reference frequency. The VCO output frequency will then be an exact multiple of the referenced frequency. If the divisor, N, is an integer, the smallest increment in the VCO output frequency value is necessarily equal to the magnitude of the reference frequency itself. Thus, in order to provide a frequency synthesizer having a small step size between adjacent output frequencies, a very low reference frequency is required. However use of a very low reference frequency introduces unacceptable effects such as limited frequency range and a long settling time for the PLL.

A technique known as fractional-N synthesis is often utilized to synthesize output signals having a frequency which is a rational multiple of the reference signal frequency. Typically, frequency divider circuits are implemented in such a manner that they only divide by an integer value and it is necessary to simulate fractional division by changing the divisor integer value temporarily during the course of a division cycle. The non-integer division ratios are realized by dividing by N+1, for example, instead of N on a proportional number of division cycles to provide an average division ratio which approximates the desired rational divisor number. For example, if the desired rational divisor is taken to be N.1, the divide value will be N for nine division cycles and N+1 for the tenth division cycle. Thus, when averaged over ten cycles the division factor equals N.1 and the VCO output frequency will be N.1 times the reference frequency. Such a fractional-N technique is disclosed in U.S. Pat. No. 3,928,813 issued to Charles A. Kingsford Smith on Dec. 23, 1975.

While such fractional-N dividers are widely used for frequency synthesis, switching between different divisor values results in undesirable phase error or phase "jitter" near the desired carrier frequency. When switching between adjacent integer divide ratios, the average divide ratio is correct, but the instantaneous divide ratio is never correct which results in phase error at the phase detector output. This phase error phase modulates the VCO to generate the spurious signals known as phase jitter. Typically, to alleviate the jitter problem a phase error correctional signal is generated and summed into the PLL. The technique, known as phase interpolation, is limited by the ability to precisely generate the required correction signal. For example, to achieve a reduction in the jitter to −70dBc requires a phase interpolation signal having less than 0.03 percent error. It is extremely difficult to generate a correctional signal having the necessary degree of accuracy and such circuitry is complex and expensive and limits the jitter performance of this fractional-N technique.

U.S. Pat. No. 4,609,881 granted to John N. Wells on Sept. 2, 1986 describes a fractional-N frequency synthesizer wherein the phase noise caused by the step change in divisor value is removed by altering the divisor value in accordance with the terms of a plurality of sequences each of which sums to zero and which represents successive rows in a Pascal's triangle. Each sequence is defined by a number of predetermined delays arranged in a predetermined order. Each predetermined sequence periodically alters the divisor value a predetermined number of times by predetermined values such that resulting phase differences present at the phase comparator sum to zero.

SUMMARY OF THE INVENTION

A frequency synthesizer constructed in accordance with the principles of the present invention comprises a variable frequency oscillator connected in a phase loop having a selectable output frequency which is a rational multiple of a reference frequency. The output of the variable frequency oscillator is coupled via a variable integer divisor frequency divider to a phase detector where it is compared with a reference frequency. The phase detector generates a control signal which is a function of the phase difference between the frequency divided variable frequency oscillator output and the reference frequency. The control signal is coupled via a loop amplifier and low pass filter to a control input at the variable frequency oscillator to control the frequency of the oscillator and lock the PLL to a selected frequency. A first modulator circuit arranged as a clocked accumulator responsive to a fractional divisor value at its input generates a modulus control signal coupled to the frequency divider to periodically increase the frequency divider integer divisor value on a proportional basis to provide an average divisor value corresponding to a selected oscillator output frequency. A plurality of additional modulator cells are connected in cascade fashion to the first modulator circuit and generate a zero-mean modulation signal which is summed with the modulus control signal and periodically varies the divisor value about its nominal value by a small amplitude, +1 or −1 for example. An individual modulator cell comprises an integrator which generates an overflow signal coupled via a summer to a differentiator circuit. For each overflow signal generated, the differentiator generates a positive pulse and then a negative pulse on the next clock pulse. The output of the differentiator circuit is coupled to the summer in the preceding modulator cell to be summed with the overflow signal produced by the preceding integrator. The output of the integrator is coupled to the input of the integrator in the next successive modulator cell. The output of the differentiator circuit for the second modulator cell is summed with the overflow output of the first modulator to provide the modulus control signal.

The variations in the frequency divider divisor value produced by the additional modulator cells sum to zero and do not affect the average divisor value, but do alter the instantaneous divisor value and the noise or jitter components of the PLL output signal due to phase modulation of the VCO resulting from the fractional-N technique. The variable frequency oscillator output frequency is an exact multiple of the reference frequency, the multiplier being the average divisor of the loop frequency divider. The variations in the divisor value produce phase error at the phase detector which, in turn, generates spurious noise in the oscillator output signal. The instantaneous variations in the phase error due to the signal generated by the modulator cells produce an increase in the spurious noise content of the oscillator at large offsets from the desired output frequency, but greatly reduce the spurious noise at small offsets from the desired output frequency when compared to conventional (single modulator) fractional-N synthesis. Increasing the number of modulator cells utilized further reduces the spurious noise or jitter near the oscillator output frequency.

The multiple cascaded modulators of the present invention are implemented in a digital circuit or in software and comprises a simple, iterated cell structure that does not require a prior determination of a control sequence. The modulator cell structure is applicable to simple, highly structured hardware or firmware implementations and is much simpler to implement than analog functions of similar complexity. The present invention provides a fractional-N phase locked loop which synthesizes a selectable output frequency having low spurious or jitter noise and which does not require the cost and complexity of generating an analog phase interpolation correction signal.

BRIEF DESCRIPTION OF THE DRAWING

A fuller understanding of the present invention will become apparent from the following detailed description taken in conjunction with the accompanying drawing which forms a part of the specification and in which:

FIG. 3b is a conceptual block diagram of a quantization model of the modulator circuit shown in FIG. 3a;

FIG. 5b is a conceptual block diagram of a modulator circuit model for the control system shown in FIG. 5a;

FIG. 7b is a diagram of an accumulator implementation of the modulator circuit of FIG. 7a;

DETAILED DESCRIPTION OF THE PREFERRED EMBODIMENT

Figure 1:
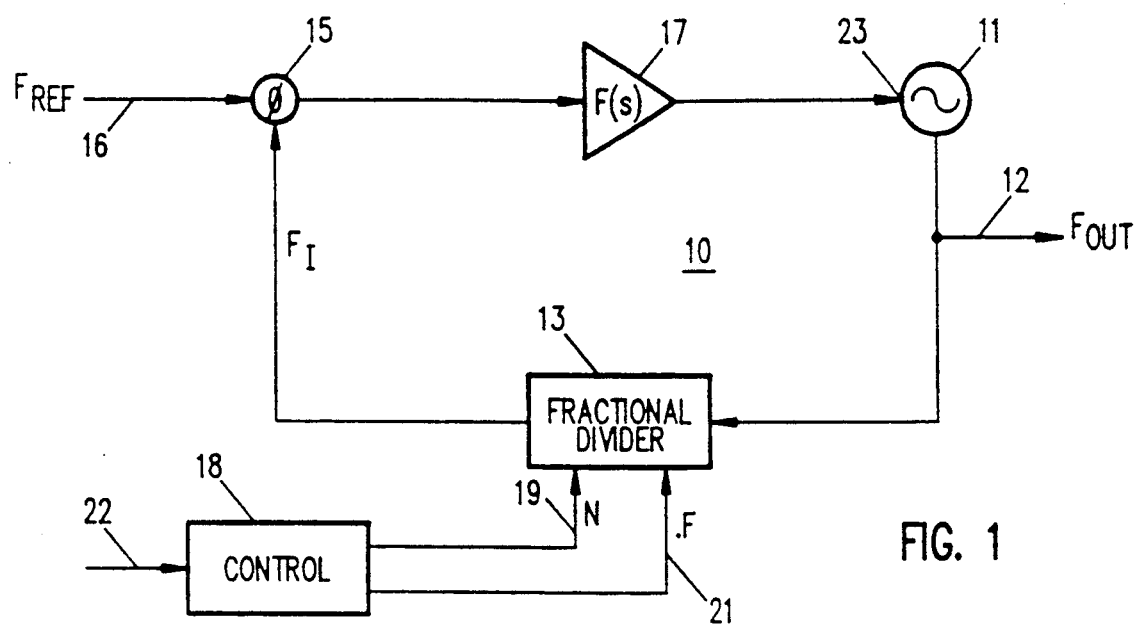
FIG. 1 is a block diagram illustrating a phase lock loop type frequency synthesizer.
Figure 2:
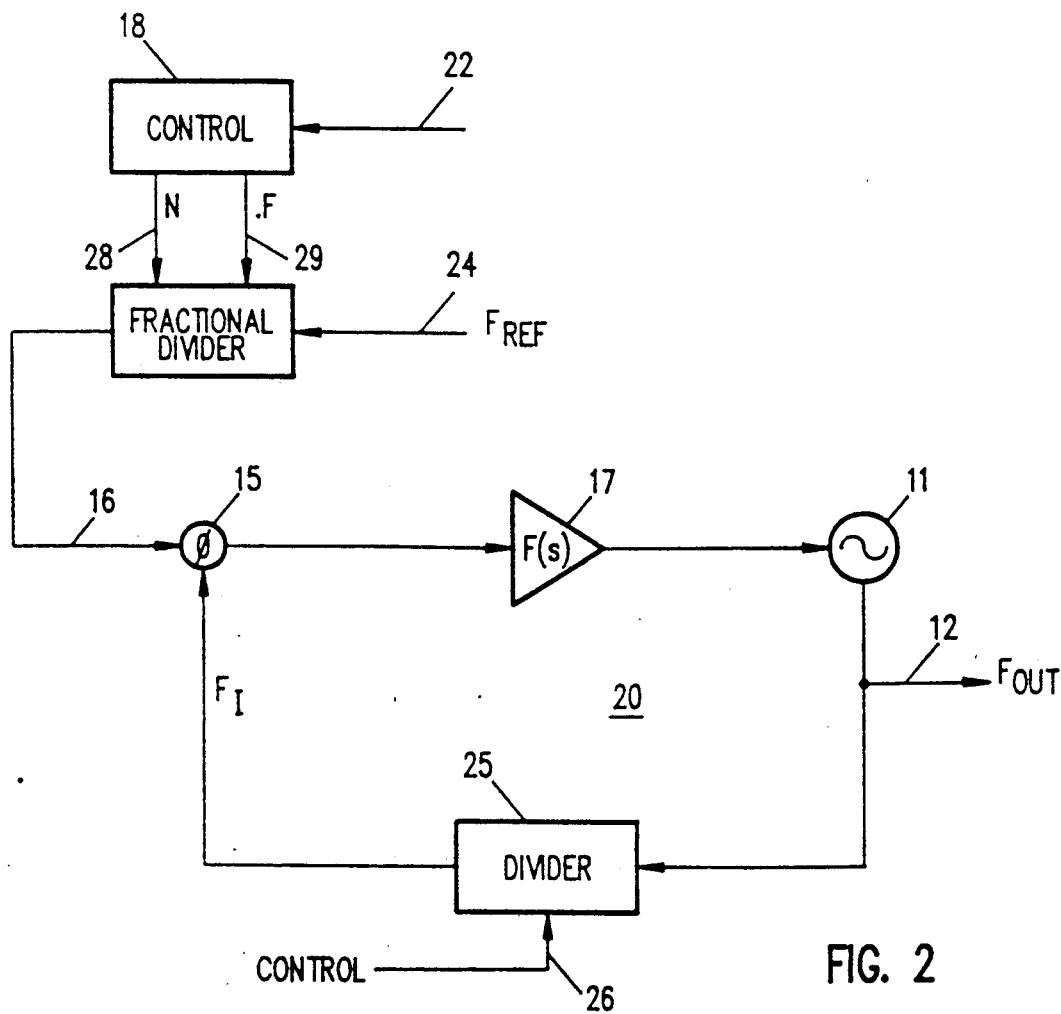
FIG. 2 is a block diagram illustrating an alternate embodiment of a phase lock loop type frequency synthesizer.

Referring now to FIGS. 1 and 2, a frequency synthesizer includes a phase lock loop (PLL) comprising a variable frequency oscillator 11 such as a voltage controlled tunable oscillator (VCO), which is controlled by a control signal at an input terminal 23 so as to provide a desired output frequency $F_{out}$ at an output terminal 12. The output of the VCO 11 is also coupled via a variable ratio frequency divider 13 to one input of a phase comparator 15. The frequency divider 13 divides the VCO output frequency, $F_{out}$, by a rational number, which may be an integer N or a fractional value N.F, prior to being compared with a reference frequency ($F_{ref}$) on line 16 at the phase detector 15. Any difference in phase or frequency between the divided VCO output signal and the reference signal applied to the phase detector 15 generates an error or control voltage to be applied at the input terminal 23 of the VCO 11. The output of the phase detector 15 is a voltage that is proportional to the difference in phase between its inputs. Typically an amplifier stage 17 is included between the phase detector 15 and the VCO 11. The amplifier 17 amplifies the error signal representing the phase difference between the reference signal and the VCO output signal and applies it as a tuning voltage to the VCO 11. Typically the loop amplifier 17 will include a low pass filter to remove non-DC components from the phase detector output as well as to define the PLL bandwidth.

The PLL 10 comprises a feedback control system that locks the phase of the VCO output signal $F_{out}$, to the phase of the reference signal $F_{ref}$. The error signal generated by the phase detector 15 controls the output frequency of the VCO 11 so as to keep the frequencies of the input signals $F_I$ and $F_{ref}$ input to the phase detector 15 exactly equal. The output frequency $F_{out}$ of the VCO 11 is an exact multiple of the reference frequency $F_{ref}$. A controller 18 in response to frequency commands on line 22 generates command signals on lines 19 and 21 to set divider 13 to the appropriate divide number to provide a desired output frequency for the VCO 11. The frequency divider 13 may be implemented so as to produce only an integer divisor value thereby producing output frequencies $F_{out}$ which are integral multiples of the reference frequency. In this case the output frequency $F_{out}$ is determined by the value N of the divide number and the step size or interval between output frequencies is determined by the value of the reference frequency. As discussed above, in order to provide a range of output frequencies having small step size it is necessary that the reference frequency be small. Alternatively, well-known techniques, such as the fractional-N techniques referenced above, may be used to provide a large frequency range with small steps between frequencies without the adverse effects encountered when utilizing extremely low reference frequencies.

Fractional-N synthesis utilizes a fractional divisor number N.F to provide output frequencies which are rational multiples of the reference frequency. To achieve the fractional N.F divide value, the value of N is periodically altered during a single division cycle so as to simulate a fractional value N.F. For example, to achieve an average divide ratio of N.1 it is necessary to increase the divide number N by 1 for one cycle out of every 10 cycles of the reference signal frequency, $F_{ref}$.

The actual implementation of a variable ratio or variable modulus divider circuit is a function of the type of divider utilized. Typically, frequency dividers are implemented with digital counters, although other well-known methods are also used. Some dividers are constructed in such a manner that they may only divide by a fixed integer ratio. Other dividers may be configured to allow one of several integer divide ratios. Further, there are often restrictions on exactly when the divide ratio may be changed in order to maintain the integrity of the relationship between the frequency of the input and output signal from the divider circuit. Typically, the fractional divider circuit utilized will be a combination of fixed modulus dividers and variable modulus dividers. For example, the fractional divider circuit may comprise a prescaler which is a 6-bit ring counter followed by a divide-by-2 circuit. In normal operation, the ring counter is set up for modulus 5 division and is followed by the divide-by-2 circuit thereby making the divisor equal to 10. The fractional divider circuit is then followed by a variable integer divide-by-N counter. The ring counter modulus may be temporarily reset from 5 to 6 for one cycle and then back to modulus 5 for the subsequent cycle resulting in a divide-by-11 operation which effectively removes one pulse of the VCO output signal or 2 Pi of accumulated phase shift from the input to the divide-by-N counter. Similarly, the ring counter modulus may be changed to 4 for one cycle and then back to modulus 5 for the next cycle resulting in a divide-by-9 operation which effectively adds a pulse of the VCO output signal or 2 Pi of accumulated phase shift to the input of the divide-by-N counter.

Referring again to FIGS. 1 and 2, the PLL 10 may be configured to include fractional divider 13 having the VCO output signal $F_{out}$ as an input and providing an intermediate frequency signal $F_I$ equal to the frequency of the reference signal $F_{ref}$ to the phase detector 15. Alternatively, as shown in FIG. 2, PLL 20 is configured with a divide-by-N circuit 25 having the VCO output frequency $F_{out}$ as an input and providing an intermediate $F_I$ to the one input of the phase detector 15. The divide-by-N circuit 25 may have a fixed integer divide number or it may have a variable integer divide number controlled by controller 18 on line 26. The PLL 20 also includes fractional divider 27 having the reference frequency $F_{ref}$ as an input on line 24 and producing an intermediate reference frequency on line 16 coupled to a second input of the phase detector 15. The variable modulus of fractional divider 27 is controlled by controller 18 on lines 28 and 29. The output of the VCO 11, $F_{out}$, then is an exact rational multiple of the reference frequency $F_{ref}$ wherein the rational multiple is a predetermined combination of the divide ratios of the divider 25 and the fractional divider 27.

Figure 3A:
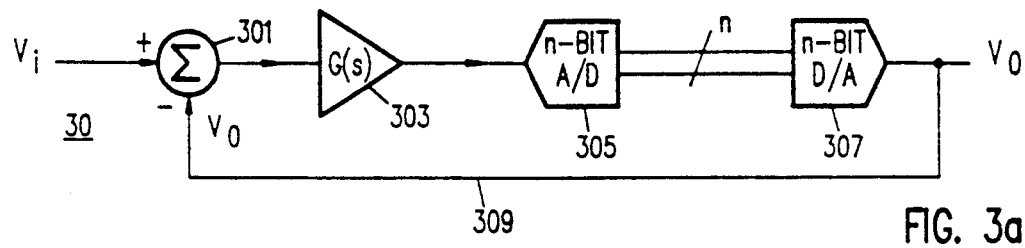
FIG. 3a is a conceptual block diagram of a modulator circuit.
Figure 3B:
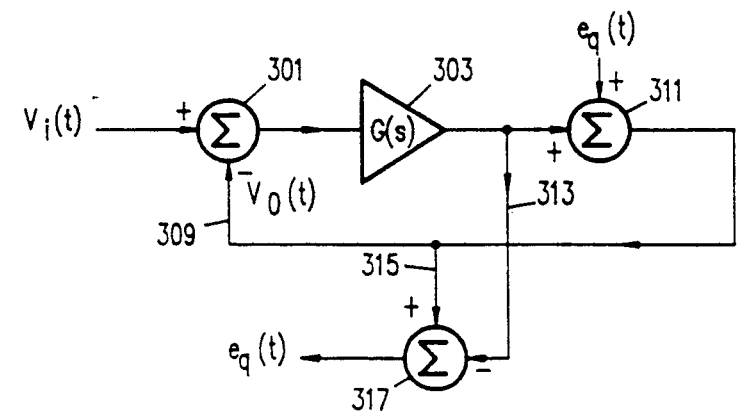
Figure 3C:
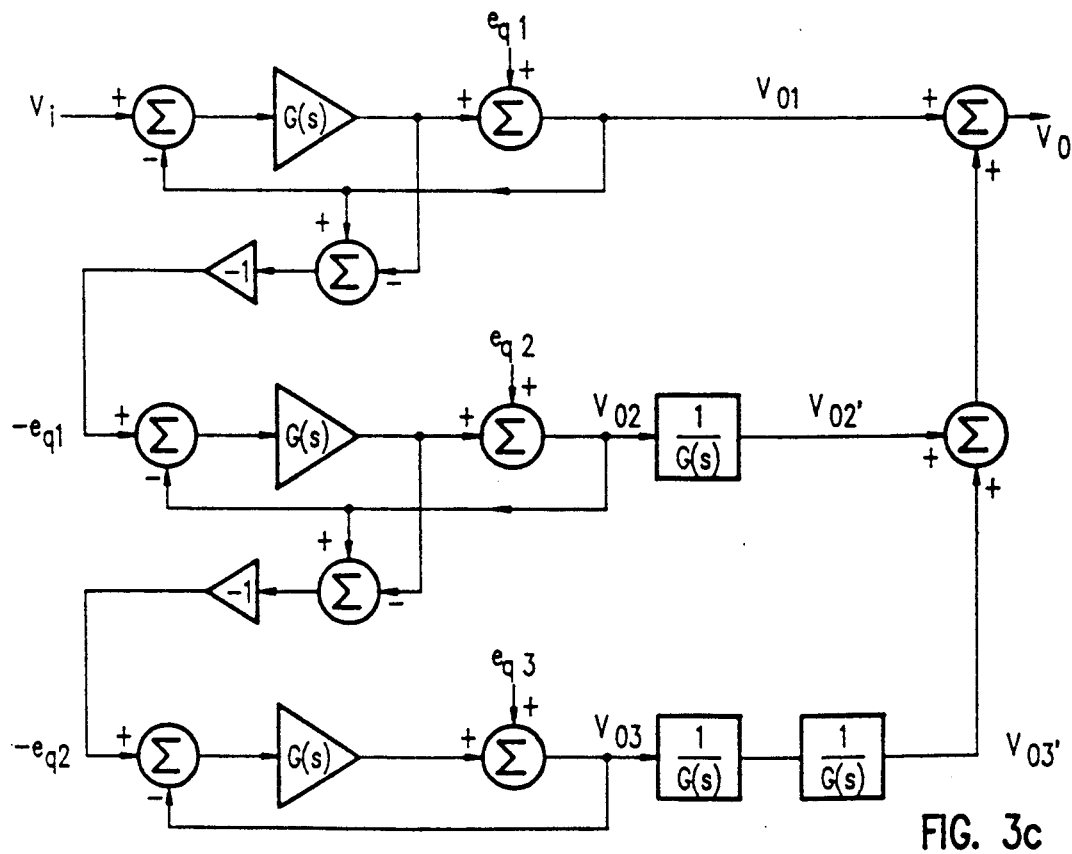
FIG. 3c is a conceptional block diagram of a multiple loop modulator system.

Referring now also to FIGS. 3a, 3b and 3c, FIG. 3a illustrates a conceptual block diagram of a modulator circuit 30 comprising summer block 301, integrating amplifier 303 having a transfer function G(s), an analog-to-digital converter (ADC) 305 and a digital-to-analog converter (DAC) 307. The output signal $v_o$ is coupled back to a minus terminal at summer 301 on line 309 to be combined with the input $v_1$. If the integrator 303 is an ideal integrator and the ADC resolution is a single bit, then the circuit 30 is known as a sigma-delta modulator. Treating the circuit 30 as a generalized loop filter and assuming that ADC 305 and DAC 307 are ideal with infinite resolution, if sampling effects (sample rate, zero order holds, etc) are ignored, then:

$$v_o/v_i = (G(s)/(1+G(s)), \qquad (1)$$

where s is a LaPlace variable in the continuous time domain.

Considering a finite resolution for ADC 305 and DAC 307 where the input to ADC 305 is sufficiently random, the effect of the analog-to-digital conversion can be remodeled as added quantization noise The quantization noise is white with $$\sigma^2 = (LSB)^2/12,$$

where LSB is the least significant bit.

FIG. 3b illustrates a block diagram of the original circuit 30 with the analog-to-digital conversion effects modelled by added quantization noise eq(t) at summer block 311. The instantaneous quantization noise is recovered and output by comparing the signals at the input 313 to the ADC 305 and output 315 of the DAC 307 at summer 317. From FIG. 3b, $$v_o/eq(t) = 1/(1+G(s)). \qquad (2)$$

In FIG. 3c a multiple loop system comprising three loops, each loop identical to the original circuit 30 with the analog-to-digital conversion errors of each loop replaced by their quantization noise models as shown in FIG. 3b. The input signal for the second and third loops is the negative of the quantization noise of the preceding loop. From FIG. 3c utilizing equations (1) and (2):

$$v_{o1} = \frac{G(s)}{1+G(s)} \cdot v_i + \frac{1}{1+G(s)} \cdot e_{q1} \qquad (eq\ 3)$$

$$V_{o2} = \frac{-G(s)}{1+G(s)} \cdot e_{q1} + \frac{1}{1+G(s)} \cdot e_{q2} \qquad (eq\ 4)$$

$$v_{o2}' = \frac{-1}{1+G(s)} \cdot e_{q1} + \frac{1}{(1+G(s))G(s)} \cdot e_{q2} \qquad (eq\ 5)$$

-continued
$$v_{o3} = \frac{-G(s)}{1 + G(s)} \cdot e_{q2} + \frac{1}{1 + G(s)} \cdot e_{q3} \quad \text{(eq 6)}$$

$$v_{o3}' = \frac{-1}{(1 + G(s))G(s)} \cdot e_{q2} + \frac{1}{(1 + G(s))G(s)^2} \cdot e_{q3} \quad \text{(eq 7)}$$

$$v_o = v_{o1} + v_{o2}' + V_{o3}' = \frac{G(s)}{1 + G(s)} \cdot v_i + \frac{1}{(1 + G(s))G(s)^2} \cdot e_{q3} \quad \text{(eq 8)}$$

If G(s) is an ideal integration, $$G(s) = 1/s \quad \text{(9)}$$

Substituting equation (9) into equation (8), $$V_o = \left[\frac{1}{s+1}\right] \cdot [v_i + s^3 e_{q3}]. \quad \text{(10)}$$

Figure 4:
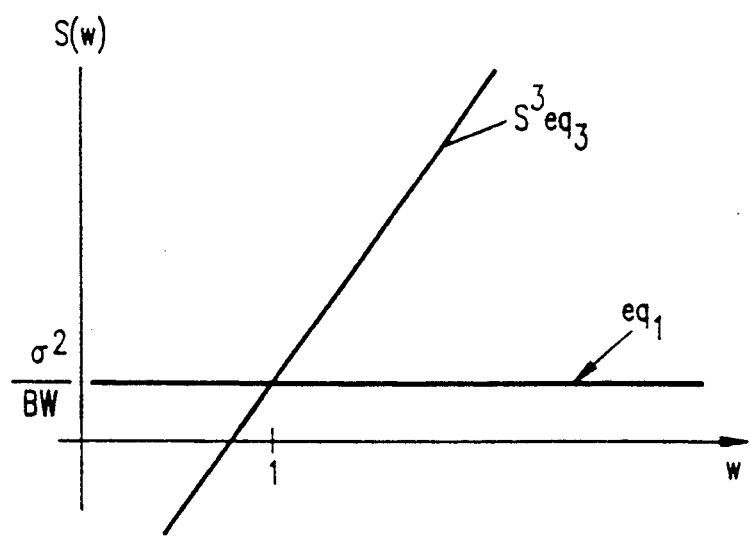
FIG. 4 is a diagram illustrating the spectral power density distribution for the quantization noise of the system shown in FIG. 3c.

In equation (10), only the quantization noise from the third loop $e_{q3}$ is present and is shaped by the term $s^3$. Consequently, quantization noise near DC levels is suppressed at the expense of increased noise at large frequencies. FIG. 4 illustrates the spectral power density distribution for the quantization noise of the circuit in FIG. 3c where the spectral power density, S(f), is a function of the frequency offset f from a signal carrier frequency; e.g., the output signal $F_{out}$ of a frequency synthesizer.

Figure 5A:
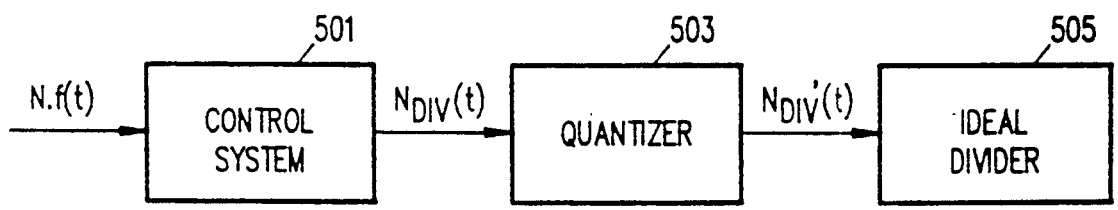
FIG. 5a is a conceptual block diagram illustrating a control system model for fractional-N synthesis.
Figure 5B:
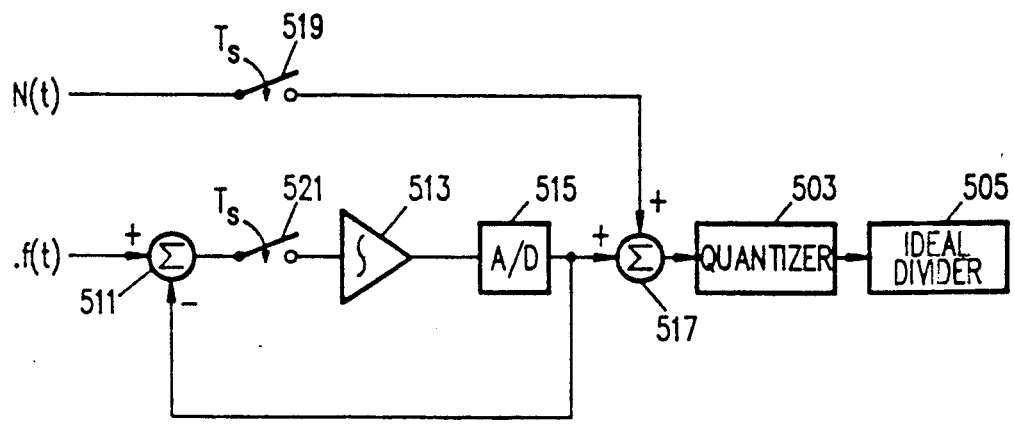
Figure 5C:
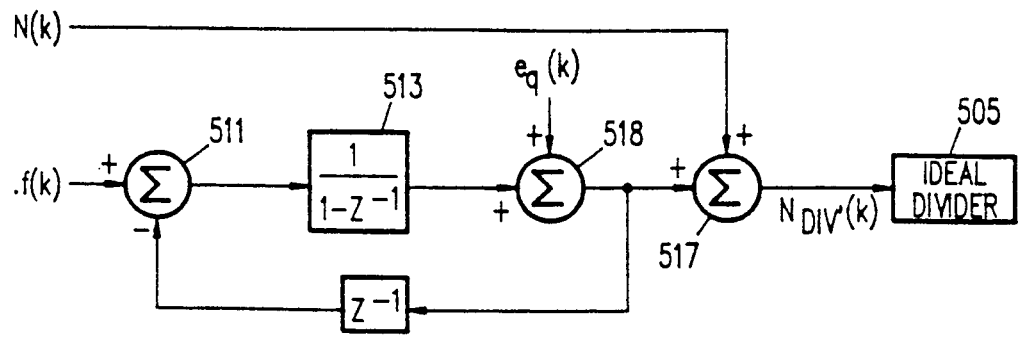
FIG. 5c is a conceptual block diagram illustrating a quantization model of the modulator circuit shown in FIG. 5b.

Referring now also to FIGS. 5a–5d, the fractional-N synthesis may be thought of as a control system 501 in combination with an ideal divider circuit 505 i.e., a divider capable of utilizing non-integer divide ratios preceded by a quantization circuit 503 as shown in FIG. 5a. Replacing the control system 501 with the sigma-delta modulator (as shown in FIG. 3a) provides a sigma-delta model for fractional-N synthesis comprising summer block 511, an ideal integrator 513 and a 1 bit ADC 515 providing an output signal to the quantization block 503. The input signal to the sigma-delta modulator is the fractional portion .F of the desired rational divide number N.F. The integer portion N of the divide number N.F. is summed with the output of the ADC 515 at summer block 517. The switches 519,521 ($T_s$) reflect the sampled nature of the circuit (i.e., the divide ratio input to the divider circuit 505 is updated every reference frequency cycle). The 1-bit DAC 307 (as shown in FIG. 3a) can be omitted if scale of the ADC 305 is taken to be 1. Converting to the sampled time domain and replacing the ADC with its quantization noise model, the circuit shown in FIG. 5c is obtained. The quantization block 503 has been combined with the quantization noise signal eq(k) on line 518. From FIG. 5c, $$N_{div}'(z) = \frac{1/(1-z^{-1})}{1 + z^{-1}/(1-z^{-1})} \cdot (f(z)) + \frac{1}{1 + z^{-1}/(1-z^{-1})} \cdot e_q(z) + N(z)$$

$$= N(z) + f(z) + (1-z^{-1}) \cdot e_q(z), \quad \text{(eq 10)}$$

where z is a LaPlace variable in the discrete time domain.

Figure 5D:
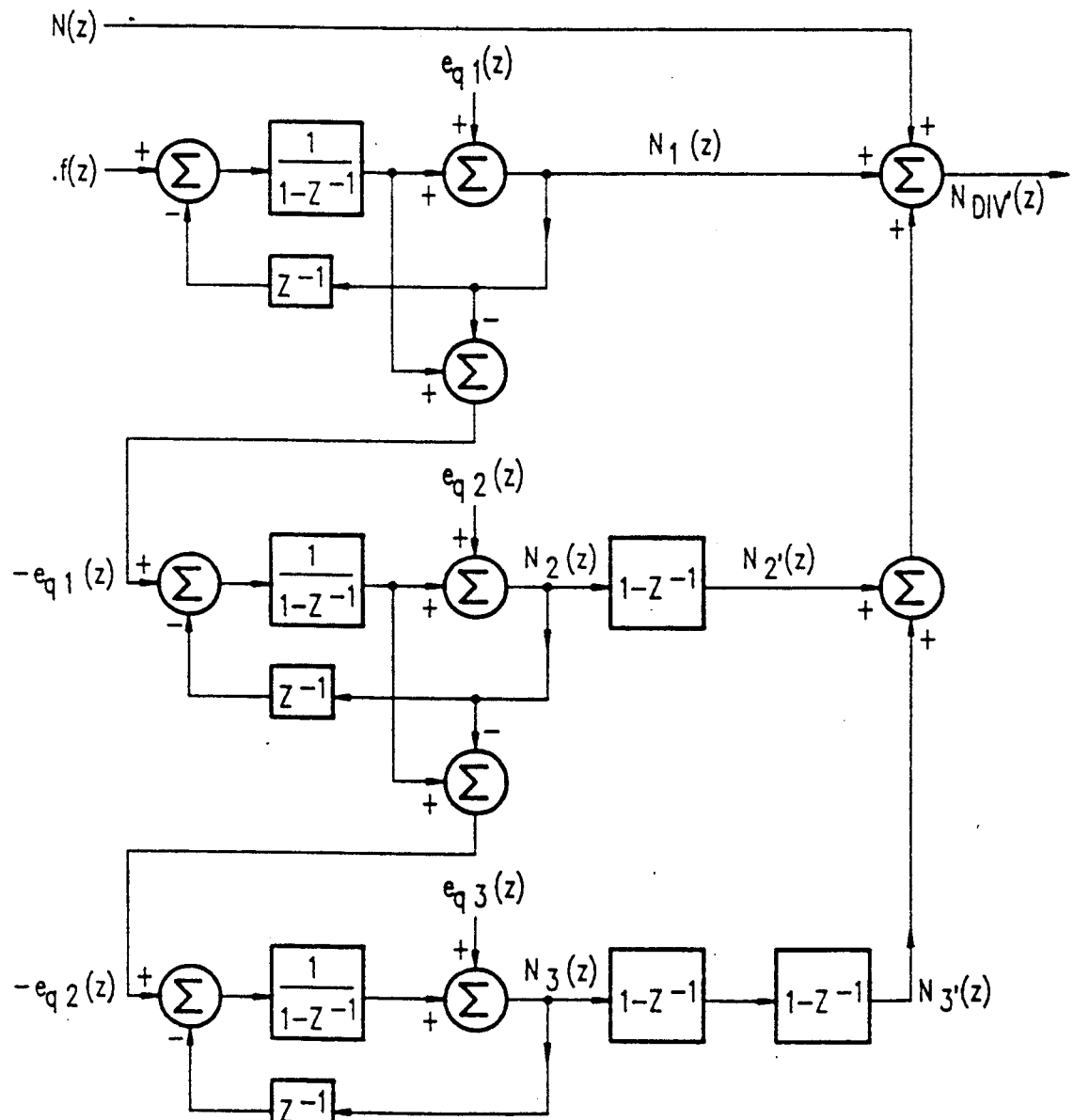
FIG. 5d is a conceptual block diagram illustrating a multiple loop modulator system for use in fractional-N synthesis.

FIG. 5d illustrates a multiple loop system comprising three loops, each loop identical to the circuit shown in FIG. 5c. The input signal for the second and third loops is the negative of the quantization noise of the preceding loop. From FIG. 5d utilizing equation (10), $$N_1(z) = (1-z^{-1})eq_1(z) + f(z); \quad \text{(11)}$$

$$N_2(z) = -eq_1(z) + (1-z^{-1})^2 eq_2(z); \quad \text{(12)}$$

$$N_2'(z) = -(1-z^{-1})eq_1(z) + (1-z^{-1})^2 eq_2(z); \quad \text{(13)}$$

$$N_3'(z) = -eq_2(z) + (1-z^{-1})eq_3(z); \quad \text{(14)}$$

$$N_3'(z) = -(1-z^{-1})^2 eq_2(z) + (1-z^{-1})^3 eq_3(z) \quad \text{(15)}$$

$$\begin{aligned}N_{div}(z) &= N(z) = N_1(z) = N_2(z) = N_3(z) = N.f(z) \\ &= (1-z^{-1})^3 eq_3(z)\end{aligned} \quad \text{(eq 16)}$$

In a locked phase-lock loop, the output signal $F_{out} = (-N_{div}) \cdot (F_{ref})$; substituting into equation (16),
$$F_{out}(z) = N.F(z)F_{ref} + (1-z^{-1})^3 F_{ref} eq_3(z). \quad \text{(17)}$$

The first term of equation 17 is the desired PLL output frequency and the second term represents the frequency noise due to fractional division.

Since $eq_3$ has a variance = 1/12 over a bandwidth of $F_{ref}$, the power spectral density of $eq_3 = 1/(12F_{ref})$. Defining $V_z$ = frequency fluctuation of $F_{out}(z)$, $$S_v(z) = |(1-z^{-1})^3 f_{ref}|^2 \cdot (1/12 f_{ref}) \quad \text{(eq 18)}$$

$$= |1-z^{-1}|^6 \cdot f_{ref}/12 \quad \text{(eq 19)}$$

To convert to phase fluctuation in the z-domain, $$w(t) = d\phi(t)/dt \quad \phi(t) = \int w(t)dt = 2\pi \int f(t)dt$$

utilizing a rectangular integration $$\Phi(z) = z^{-1}\Phi(z) + W(z)T_s \quad \text{(eq 20)}$$

$$\Phi(z) \cdot (1 - z^{-1}) = T_s W(z)$$

$$\Phi(z) = \frac{T_s W(z)}{1 - z^{-1}} = \frac{2\pi T_s V(z)}{1 - z^{-1}}$$

Since $T_3 - 1/F_{ref}$ = time between samples, substituting into equations (19) and (20), $$\Phi(z) = \frac{(2\pi)^2}{|1 - z^{-1}|^2 f_{ref}^2} \cdot \frac{|1 - z^{-1}|^6 f_{ref}}{12} \quad \text{(eq 21)}$$

$$= \frac{(2\pi)^2}{12 f_{ref}} |1 - z^{-1}|^4 \text{ rad}^2/\text{Hz}$$

Figure 6:
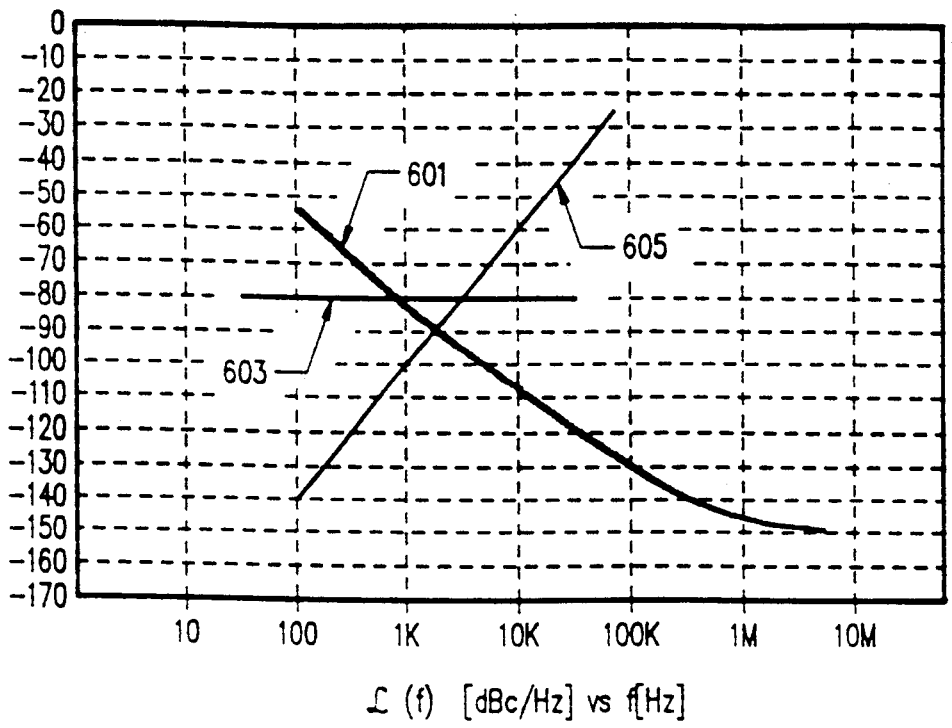
FIG. 6 is a diagram plotting fractional-N synthesis phase error noise as a function of offset frequency for the system of FIG. 5d.

The term $(1 - z^{-1})$ behaves as a differentiator with unity gain at $f = f_{ref}/2\pi$ and generalizing to m loops, $$L(f) = \frac{(2\pi)^2}{12 f_{ref}} \left[\frac{f}{f_{ref}/2\pi}\right]^{2(m-1)} \text{ rad}^2/\text{Hz}, \quad \text{(eq 22)}$$

where L(f) represents single side band phase noise. FIG. 6 is a plot of the fractional synthesis phase error noise as defined by equation (22) for a fractional-N PLL including a 0.5–1.0 GHz varactor tuned, single band VCO. $F_{ref}$ is 200KHz and the number of loops, m, is 3. The VCO phase noise is shown by curve 601 while the phase detector noise is a flat line 603. The fractional division noise curve 605 intersects the VCO phase noise 601 at an outset (from the carrier frequency, $F_{out}$) greater than where the phase detector phase noise 603 intersects the VCO phase noise curve 601. The phase noise (jitter) due to the fractional division is greatly reduced at the carrier frequency, but becomes larger at large offsets (greater than 5KHz in this example) from the carrier frequency. Designing the PLL for narrow bandwidth and utilizing additional filtering outside the PLL bandwidth rejects the fractional division phase noise energy and provides a fractional-N PLL without sophisticated correction circuitry.

Figure 7A:
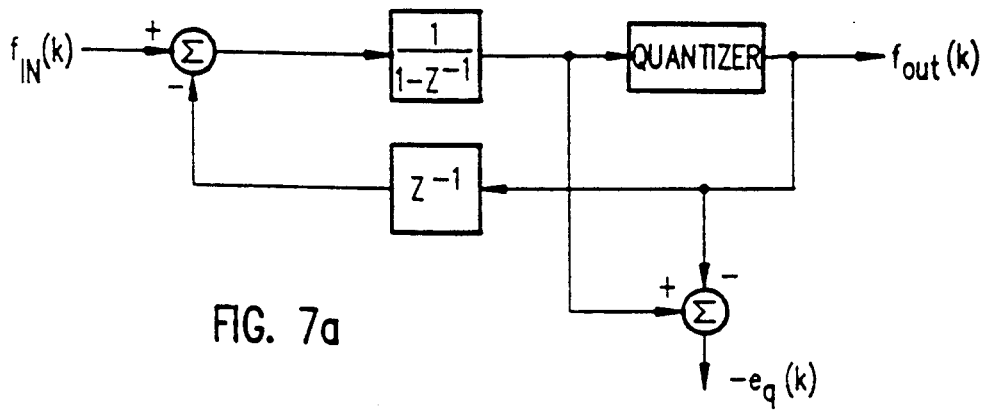
FIG. 7a is a block diagram of a single modulator loop for the system shown in FIG. 5d.
Figure 7B:
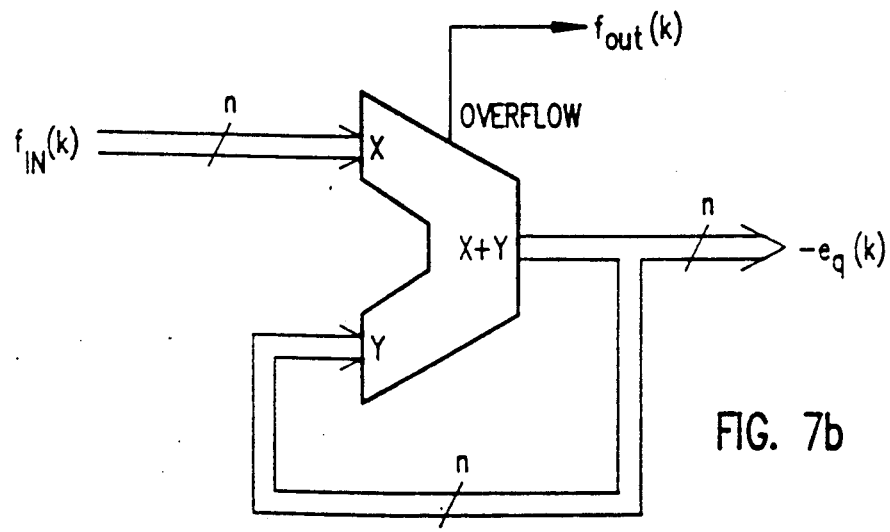

Referring now also to FIGS. 7a and 7b, the block diagram for each sigma-delta modulator is a moderately complex circuit, but since the function $1/(1-z^{-1})$ is an integration function, the circuit shown in FIG. 7a can be implemented with a single, readily available accumulator circuit as shown in FIG. 7b. Similarly, the function $(1-z^{-1})$ can be implemented as a differentiator circuit. While the modulator cell 30 has been described and implemented as an integrator circuit, the transfer function G(s) is not restricted to an integration function, but may be any transfer function which provides the desired quantization noise characteristics. Similarly, the single integrator implementation (as shown in FIG. 8) is simple to implement and provides good results, but may, for example, be implemented as two or more cascaded integrator circuits.

Figure 8:
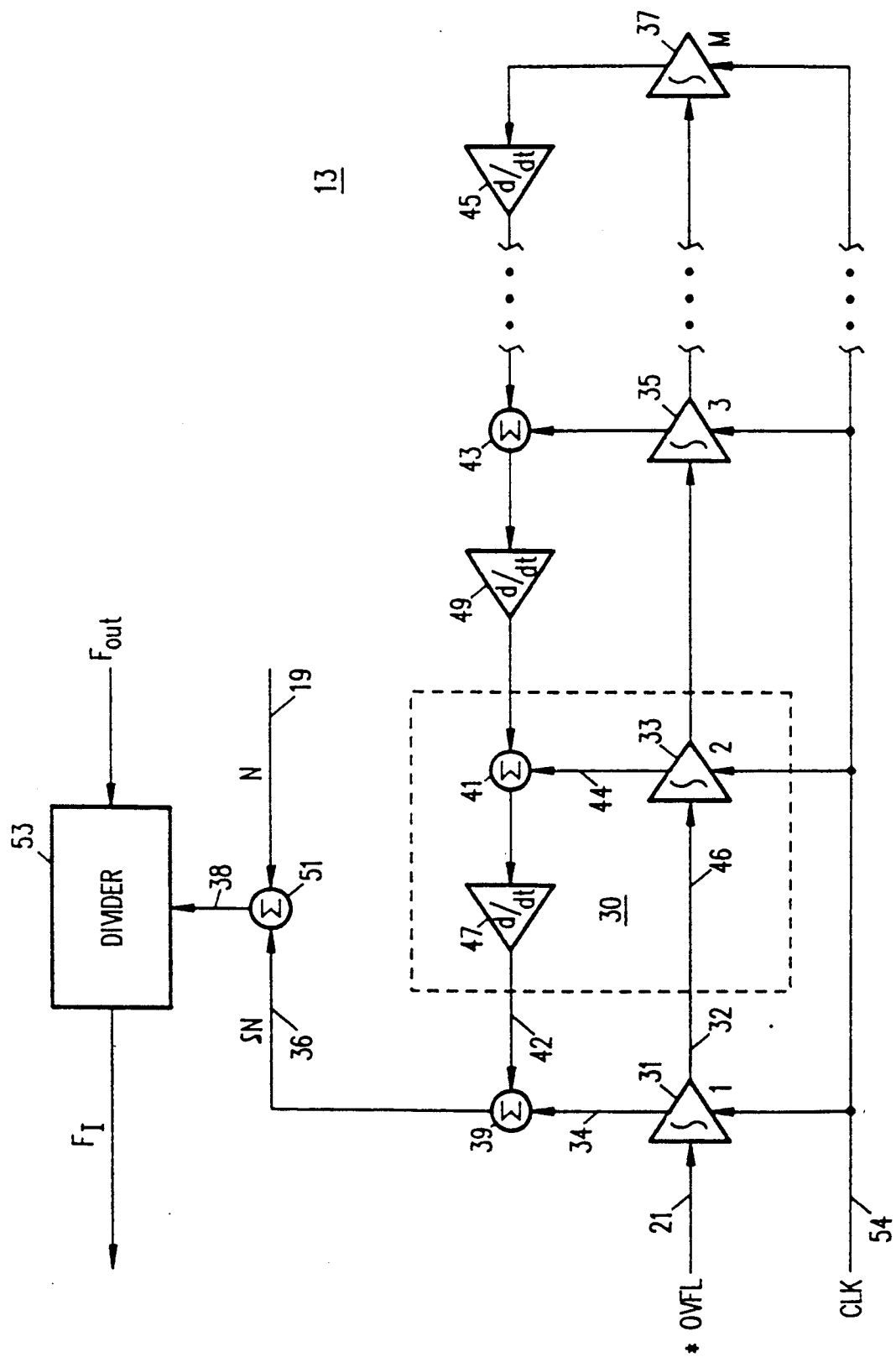
FIG. 8 is a detailed block diagram illustrating a modulus control circuit according to the principles of the present invention.

Referring now also to FIG. 8, a detailed block diagram of a multiple modulator fractional divider, fractional divider 13 as shown in FIG. 1, for example, according to the principles of the present invention is shown. The fractional divider 13 comprises an integer divide circuit 53 having an integer divide value which is modulated by a modulus control signal on line 38. The modulator control signal on line 38 is provided by the multiple loop modulator circuit shown in FIG. 5d. The divider 53 provides an intermediate $F_I$ which is equal to the VCO output frequency $F_{out}$ divided by the integer divide value of the divider 53. The modulus control signal on line 38 comprises the integer divide value N on line 19 provided by controller 18 and a modulation signal δN on line 36 which is derived from the fractional portion .F provided by controller 18 on line 21. The modulus control signal on line 38 modulates the nominal integer value N of the frequency divider 53 to provide an average divide value for the divider 53 of N.F. The fractional portion of the divisor value N.F is coupled to an integrator 31 on line 21 to generate the δ N signal on line 36. A series of cascaded modulator cells 30 are coupled to the output of integrator 31. Each modulator cell 30 is identical and comprises a sigma-delta modulator implemented as an integrator 33, a summer circuit 41 and a differentiator circuit 47. In this example, only three additional modulator cells 30 are illustrated, but additional modulator cells may be provided as required. Each of the integrators 31, 33, 35, 37 has an integration function of $1/(1-z^{-1})$ and is commonly referred to as an accumulator. Similarly each of the differentiator circuits 47, 49, 45 is characterized by differentiation function of $1-z^{-1}$. A new value of δ N on line 36 is computed once per period of the reference clock $F_{ref}$. The clock signal on line 54 has an average frequency greater than or equal to the output frequency of divider 53, $F_I$, and may be obtained directly from the output of divider 53. A clock frequency greater than $F_I$ can be utilized to provide multiple clock cycles in which to perform the mathematical calculations of δ N on line 36. Typically a clock signal having a frequency greater than $F_I$ is obtained by dividing the output frequency of the VCO $F_{out}$. In all cases the modulus control signal on line 38 is updated once per period of the output frequency $F_I$ of divider circuit 53.

In a well-known manner, the value on line 21 is input to the integrator 31 and is added to the value already held in integrator 31 and a new sum is instantly made available on the output line 32 which also represents the input line for integrator 33. When the value held by an integrator or accumulator reaches a predetermined value, labeled "OVFL", it generates an overflow or carry signal on line 34 as an input to summer 39. The overflow signal on line 34 then is summed with any signal which may be on line 42 at the summer 39 to generate the δ N signal on line 36. All of the integrators 31, 33, 35, 37 have the same overflow value, but because the integrators are cascaded together those integrators furthest from the input line 21 will overflow more rapidly than the integrators closer to the input line 21. The fractional portion of the average divide ratio thus obtained is the value represented on input line 21 divided by the value OVFL. For example, in a system where the integrator's overflow at a value of 1000 and a value on the input line 21 is 27, the fractional portion of the divide ratio thus obtained will be 0.027. The overall average divide ratio of the divider 53 will be N.027, where N is the value input to summer 51 on line 19. Therefore the value input to integrator 31 on line 21 is a fractional portion of the average divide ratio, N.F, times the overflow value for the integrator 31, .F*OVFL.

Figure 9A:
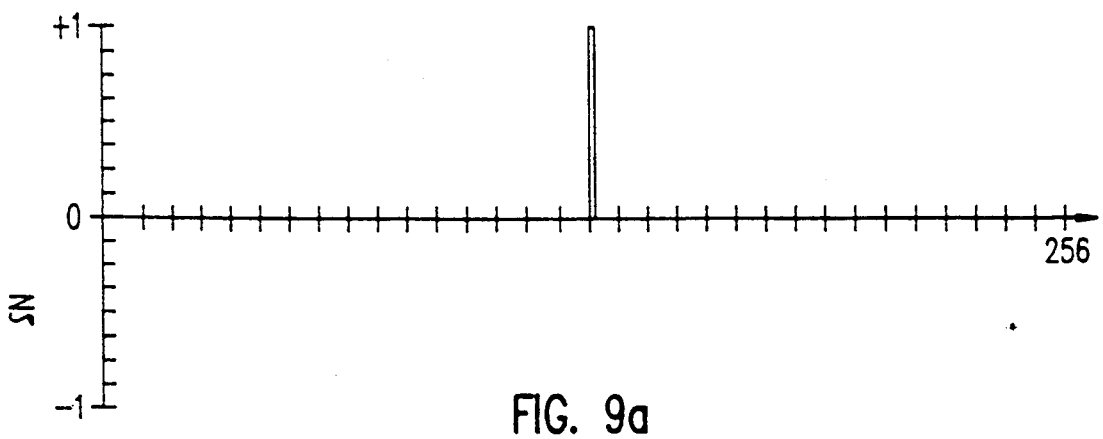
FIGS. 9a and 9b are timing diagrams illustrating the modulus control signal and the instantaneous phase error for an a single modulator fractional divider.
Figure 9B:
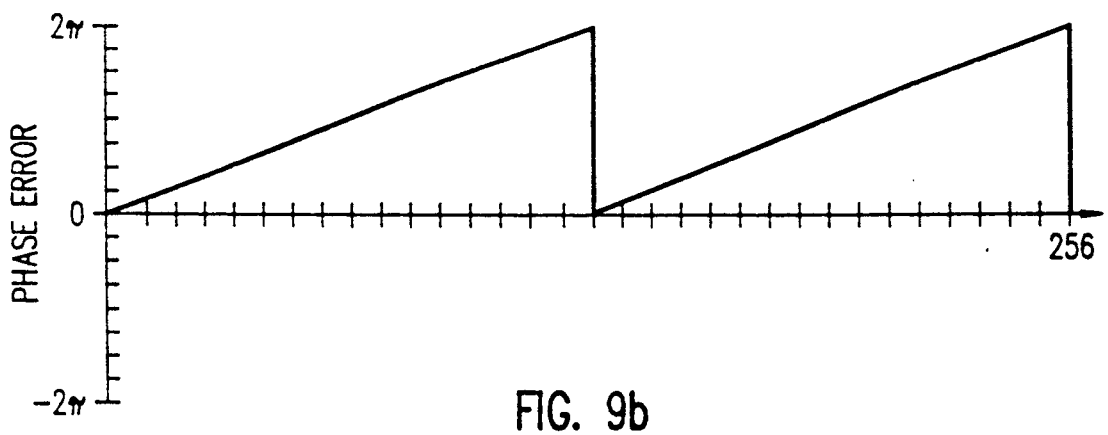
Figure 10:
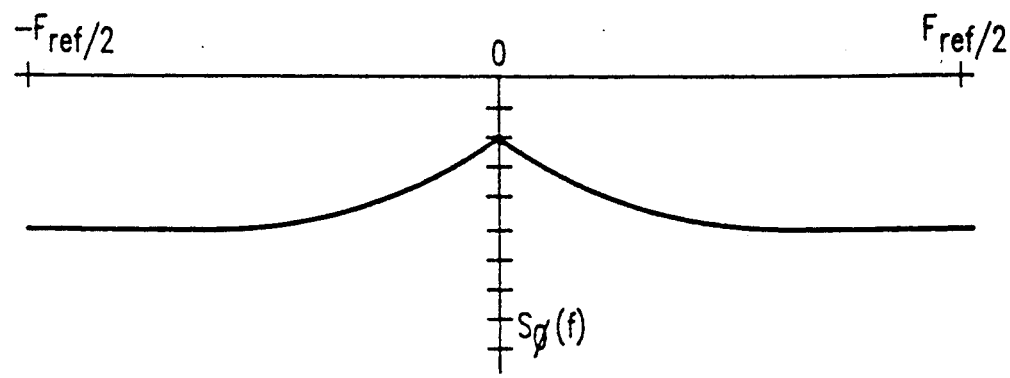
FIG. 10 is a diagram illustrating the spurious or jitter noise distribution for a conventional single modulator fractional divider.

Referring now also to FIGS. 9a and 9b, consider a fractional divider 13 wherein only one modulator 31 (implemented as integrator 31), and no additional modulator cells, is utilized. If the fractional portion of the desired divide ration is 1/128 and the overflow value for the integrator 31 is 128, then the integrator 31 will generate an overflow or carry signal once every 128 cycles of the clock on line 54. The overflow signal on line 34 will cause a N=1 signal to be present on line 36 for 1 clock period. Therefore the nominal integer value N of the divisor for divider 53 is increased by 1 for 1 clock period out of every 128 clock periods. FIG. 9a illustrates the modulus control signal on line 38 versus time. FIG. 9b plots the phase error versus time. A cyclic phase error exists because the fractional divider 13 provides only the correct average divide ratio, not the correct instantaneous divide ratio. FIG. 10 is a plot of the power spectral density Sφ(f), where f is the outset frequency, of the spurious noise or jitter resulting from the phase error shown in FIG. 9b and exhibits a peak at the carrier or desired VCO output frequency.

Figure 11A:
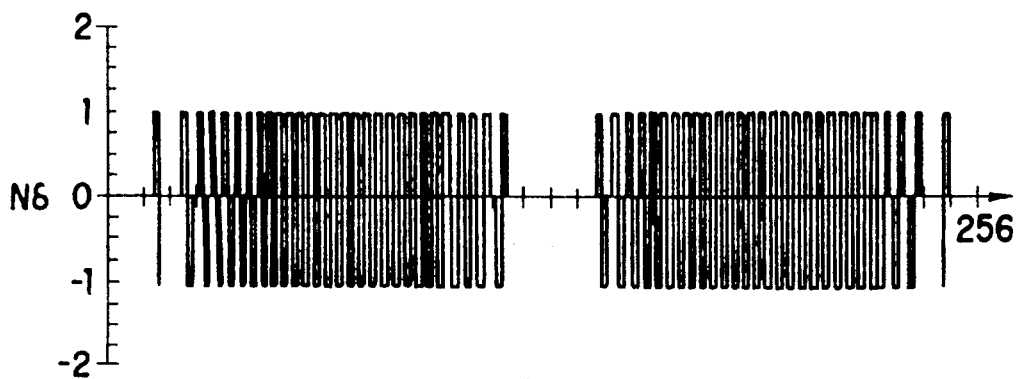
FIGS. 11a and 11b are timing diagrams illustrating the modulus control signal and the instantaneous phase error for a two modulator fractional divider incorporating the modulus control circuit shown in FIG. 8.
Figure 11B:
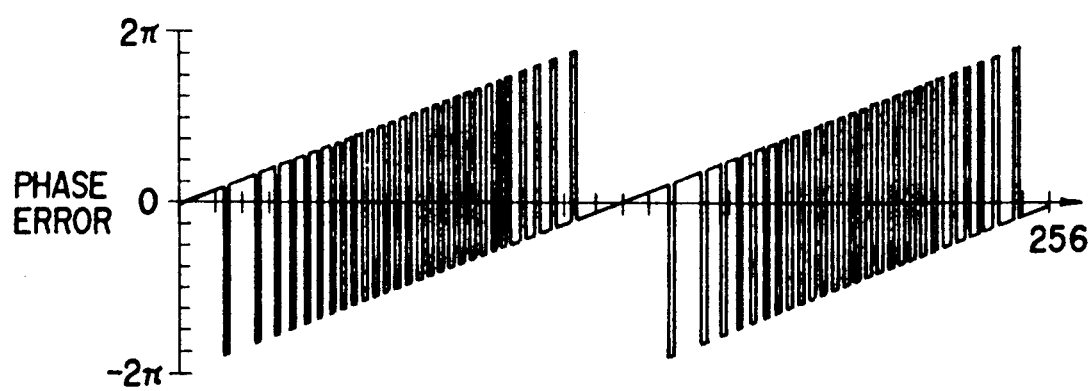
Figure 12:
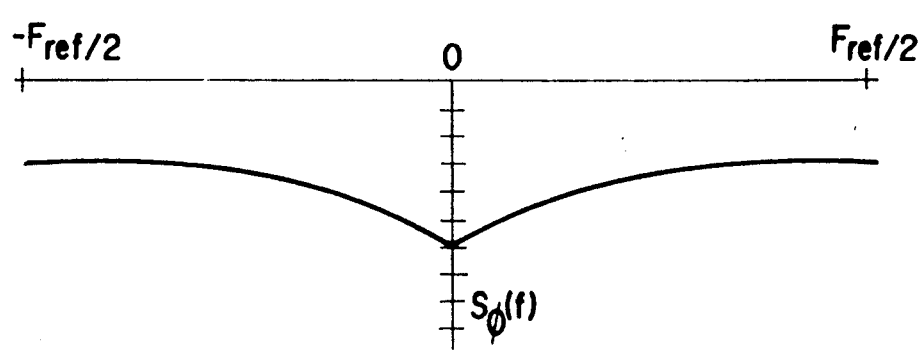
FIG. 12 is a diagram illustrating the spurious or jitter noise distribution for a two modulator fractional divider.

Referring now to FIGS. 11a, 11b and 12, the same data is plotted for a fractional divider circuit 13 including one additional modulator circuit 30 wherein the input 46 of integrator 33 is connected to the output 32 of integrator 31. The overflow output of integrator 33 is coupled on line 44 to differentiator 47 via summer 41. The output of the differentiator 47 is coupled to summer 39 on line 42. For each overflow or carry signal generated by integrator 33, differentiator 37 will generate a positive output pulse on the same clock pulse as integrator 33 produced the carry signal and will produce a negative pulse on the next following clock pulse. Thus the nominal integer value divisor for divider 53 will be increased by one on a first clock pulse and decreased by one on a next subsequent clock pulse producing a net change in the divisor of 0. In the above-described system, if .F=1 and the overflow value=128, and assuming that initially both integrators 31, 32 have a value of 0, integrator 31 will generate an overflow signal on the 128th clock pulse. However, integrator 33 will produce overflow signals on the eleventh, twentieth, twenty-fifth, thirtieth, clock pulses etc. FIG. 11a plots the change in the modulus control signal on line 38 versus time and FIG. 11b plots the instantaneous phase error versus time. A comparison of FIGS. 9a and 9b and 11a and 11b, respectively, illustrates the effect on the modulus control signal that the extra modulator cell 30 has generated. The average change in the modulus control signal and the phase error due to the modulator cell 30 is 0 while the modulation of the modulus control signal due to integrator 31 provides an average overall divisor ratio for divider 53 of 1/128. FIG. 12 illustrates the spectral power density of the spurious noise produced by the phase error. The modulation of the nominal integer divide number produces an increased overall spurious noise content. However, the spurious noise energy is greatly reduced at small offsets from the desired output signal; the crossover point being at approximately $F_{out}$ divided by 6. The spurious noise energy at large offsets may be easily filtered by conventional means to provide a signal having a desired frequency with substantial less jitter noise than that produced by conventional fractional-N synthesis methods.

Although the present invention has been shown and described in connection with certain specific embodiments, it will be readily apparent to those skilled in the art that various changes in form and arrangement may be made without departing from the spirit of the invention or exceeding the scope of the claims appended hereto.

I claim:
1. A variable frequency synthesizer comprising:
   a variable frequency oscillator for generating an output signal having a selectable output frequency which is a rational multiple of the frequency of a reference signal:
   frequency divider means having an input coupled to the output of said variable frequency oscillator, said frequency divider means having a selectable variable integer divisor, said frequency divider means for producing an intermediate signal having a frequency equal to the frequency of the variable frequency output signal divided by said variable divisor value;
   phase comparison means coupled to said frequency divider means for comparing the phase of said intermediate signal to the phase of a reference signal and generating an error signal indicative of a phase difference therebetween, said error signal coupled to a control input at said variable frequency oscillator;
   first means coupled to an input of said frequency divider means, said first means responsive to a control signal representative of a fractional divisor value for generating a first modulation signal to periodically temporarily alter said integer divide value such that said frequency divider means has a predetermined average rational divisor value; and
   second means coupled to an output of said first means and having an output coupled to said frequency divider means, said second means responsive to a first sum signal output by said first means for generating a second modulation signal varying the value of said integer divisor, the net change in said integer divisor value due to said second modulation signal being zero.

2. A frequency synthesizer as in claim 1 further comprising at least one additional means coupled to an output of said second means and responsive to a second sum signal output by said second means for generating a third modulation signal, said third modulation signal being coupled back to said second means and summed with said second modulation signal.

3. A frequency synthesizer as in claim 2 wherein said first means comprises an integrator means having an input for receiving said control signal, said integrator means responsive to said control signal for generating an overflow signal and said first sum signal.

4. A frequency synthesizer as in claim 3 further comprising summer means connected between said first integrator means and said frequency divider means, said summer means having a first input for receiving said overflow signal and a second input coupled to said second means for receiving said second modulation signal, said summer means generating said first modulation signal, said first modulation signal being the sum of said overflow signal and said second modulation signal.

5. A frequency synthesizer as in claim 4 wherein said second means and each said additional means comprises a modulator cell, each said modulator cell comprising:
   clocked integrator means having an input port and first and second output ports;
   summer means having an output port and first and second input ports, said first input port coupled to said integrator means first output port for receiving an overflow signal generated by said clocked integrator means; and
   differentiator means having an input port and an output port, said differentiator means input port coupled to said summer means output port, said differentiator means responsive to a pulse at its input port for generating a first output pulse of identical polarity and a second output pulse of opposite polarity following said first output pulse; and
   said modulator cells coupled together in cascade fashion, said integrator means second output port coupled to the next succeeding integrator means input port, said differentiator means output port coupled to said summer means input port of the immediately preceding modulator cell.

6. A frequency divider for dividing the frequency of an input signal by a selectable rational number comprising:
   frequency divider means having an input for receiving an input signal, an output for outputting an output signal, the frequency of said output signal being the frequency of said input signal divided by a selectable rational number, said frequency divider means including a modulus control input for receiving a modulus control signal;
   first means coupled to said modulus control input of said frequency divider means, said first means responsive to a control signal representative of a fractional divisor value for generating a first modulation signal for periodically temporarily altering an integer divide value such that said frequency divider means has a predetermined average rational divisor value; and
   second means coupled to an output of said first means and having an output coupled to said frequency divider means, said second means responsive to a first signal output by said first means for generating a second modulation signal periodically varying the value of said integer divider value, the net change in said integer divisor value due to said second modulation signal being zero.

7. A frequency divider as in claim 6 further comprising at least one additional means coupled to an output of said second means and responsive to a second signal output by said second means for generating a third modulation signal, said third modulation signal coupled back to said second means and summed with said second modulation signal.

8. A frequency divider as in claim 6 wherein said first means comprises accumulator means having an input for receiving said control signal, said accumulator means responsive to said control signal for generating an overflow signal and a first sum signal.

9. A frequency divider as in claim 8 further comprising summer means connected between said first accumulator means and said frequency divider means, said summer means having a first input for receiving said overflow signal and a second input coupled to said second means for receiving said second modulation signal, said summer means generating said first modulation signal, said first modulation signal being the sum of said overflow signal and said second modulation signal.

10. A frequency divider as in claim 9 further comprising a plurality of modulation cells, said second means and each said modulation cell comprising:

accumulator means having an input port and first and second output ports;

summer means having an output port and first and second input ports, said first input port coupled to said accumulator means first output port for receiving an overflow generated by said accumulator means; and differentiator means having an input port and an output port, said differentiator means input port coupled to said summer means output port said differentiator means responsive to a pulse at its input port for generating a first output pulse of identically plurality and a second output pulse of opposite plurality following said first input pulse; and said modulator cells coupled together in cascade fashion, said accumulator second output port coupled to the next succeeding accumulator means input port, said differentiator means output port coupled to said summer means input port of the immediately proceeding modulator cell.

* * * * *